(12) United States Patent
Chen

(10) Patent No.: US 8,811,009 B2
(45) Date of Patent: Aug. 19, 2014

(54) AIR DUCT AND COMPUTER SYSTEM WITH AIR DUCT

(75) Inventor: Li-Ping Chen, New Taipei (TW)

(73) Assignee: Hon Hai Precision Industry Co., Ltd., New Taipei (TW)

( * ) Notice: Subject to any disclaimer, the term of this patent is extended or adjusted under 35 U.S.C. 154(b) by 224 days.

(21) Appl. No.: 13/473,676

(22) Filed: May 17, 2012

(65) Prior Publication Data

US 2013/0148290 A1 Jun. 13, 2013

(30) Foreign Application Priority Data

Dec. 9, 2011 (TW) .............................. 100145485 A

(51) Int. Cl.
*G06F 1/20* (2006.01)

(52) U.S. Cl.
USPC ............ 361/679.46; 361/679.51; 361/679.49; 454/322; 165/80.1; 165/80.2; 165/80.3

(58) Field of Classification Search
CPC .................................. G06F 1/20; F24F 13/10
USPC .............. 361/679.46–679.54; 165/80.2–80.5, 165/104.33; 454/322
See application file for complete search history.

(56) References Cited

U.S. PATENT DOCUMENTS

| | | | | |
|---|---|---|---|---|
| 7,542,289 | B2 * | 6/2009 | Tsai et al. | 361/695 |
| 8,149,578 | B2 * | 4/2012 | Neumann et al. | 361/690 |
| 8,300,409 | B2 * | 10/2012 | Wei et al. | 361/690 |
| 8,353,746 | B2 * | 1/2013 | Tsai et al. | 454/284 |
| 2009/0034190 | A1 * | 2/2009 | Tsai et al. | 361/695 |
| 2009/0233537 | A1 * | 9/2009 | Kao et al. | 454/184 |
| 2010/0105313 | A1 * | 4/2010 | Tsai et al. | 454/284 |
| 2010/0165568 | A1 * | 7/2010 | Tsai et al. | 361/679.49 |
| 2011/0103005 | A1 * | 5/2011 | Neumann et al. | 361/679.46 |
| 2013/0163191 | A1 * | 6/2013 | Chen et al. | 361/679.46 |
| 2013/0163199 | A1 * | 6/2013 | Chen | 361/690 |

* cited by examiner

*Primary Examiner* — David M Sinclair
*Assistant Examiner* — Robert Brown
(74) *Attorney, Agent, or Firm* — Novak Druce Connolly Bove + Quigg LLP

(57) ABSTRACT

An air duct includes a top wall and a blocking plate. The top wall includes a limiting block, a resilient arm, and a pair of hooks. A latching slot is defined between the pair of hooks. The blocking plate is rotatably secured to the top panel and includes a body and a shaft connected to the body. The shaft is rotatably engaged in the latching slot. The limiting block and the resilient arm abut two opposite surfaces of the body and block the body preventing the blocking plate from rotating relative to the top wall. The blocking plate is adapted to abut an electronic component and guide airflow towards the electronic component.

20 Claims, 7 Drawing Sheets

AIR DUCT AND COMPUTER SYSTEM WITH AIR DUCT

BACKGROUND

1. Technical Field

The present disclosure relates to a computer system with an airflow guiding duct.

2. Description of Related Art

An air duct is commonly used for facilitating heat dissipation of electronic components of a computer system. The air duct covers the electronic components of the computer system to guide airflow from fans to the electronic components. For a large sized computer system, such as a server system, which has a great number of electronic components, a large sized air duct is needed to dissipate a massive amount of heat from electronic components. However, some space around the electronic components is empty, but the air still flows through the empty space, thus decreasing the dissipation efficiency.

BRIEF DESCRIPTION OF THE DRAWINGS

Many aspects of the embodiments can be better understood with references to the following drawings. The components in the drawings are not necessarily drawn to scale, the emphasis instead being placed upon clearly illustrating the principles of the embodiments. Moreover, in the drawings, like reference numerals designate corresponding parts throughout the several views.

DETAILED DESCRIPTION

The disclosure is illustrated by way of example and not by way of limitation in the figures of the accompanying drawings in which like references indicate similar elements. It should be noted that references to "an" or "one" embodiment in this disclosure are not necessarily to the same embodiment, and such references mean at least one.

Figure 1:
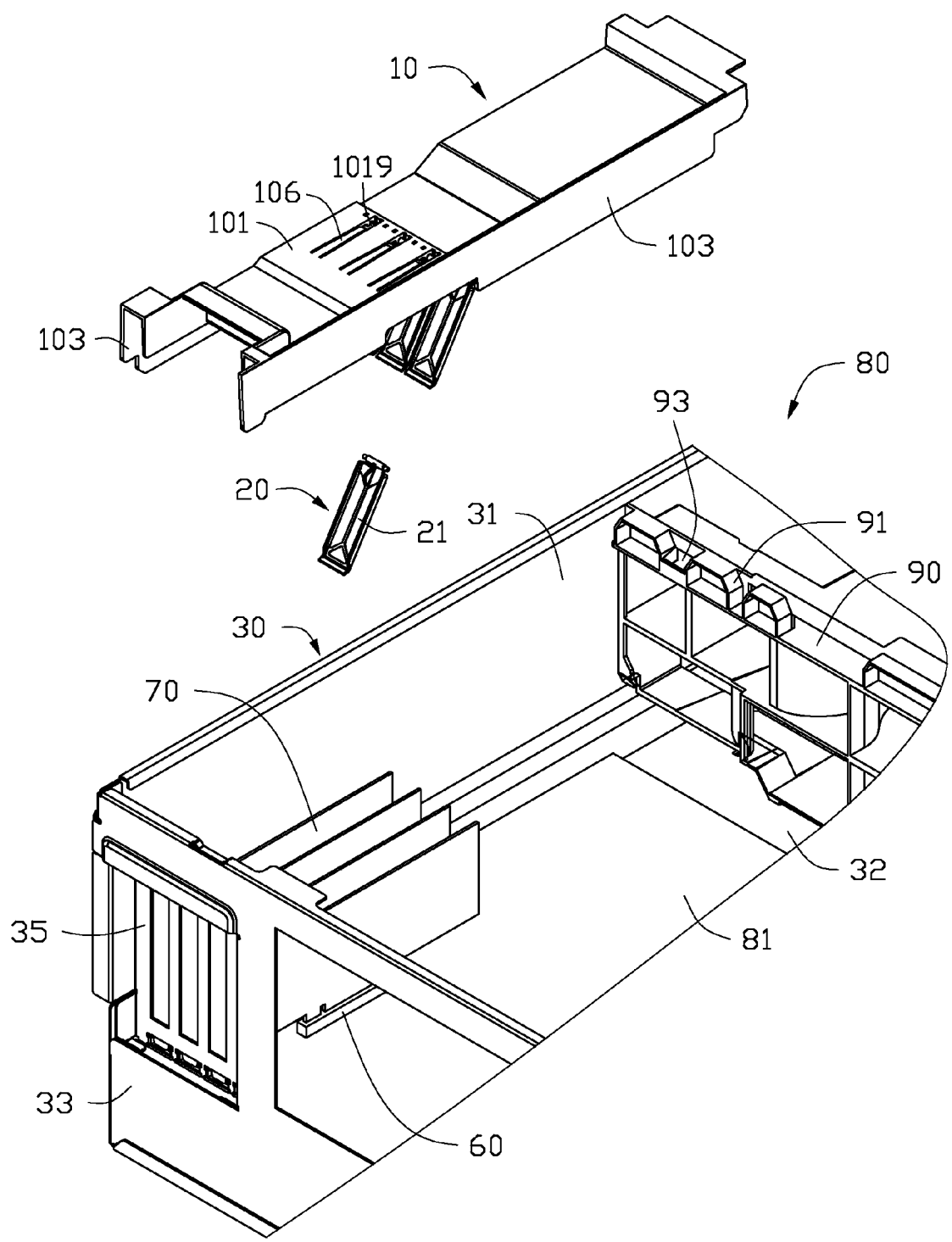
FIG. 1 is a partially exploded, isometric view of a computer system in accordance with an embodiment.

FIG. 1 is a computer system in accordance with an embodiment including an air duct 10 and a host 80.

Figure 2:
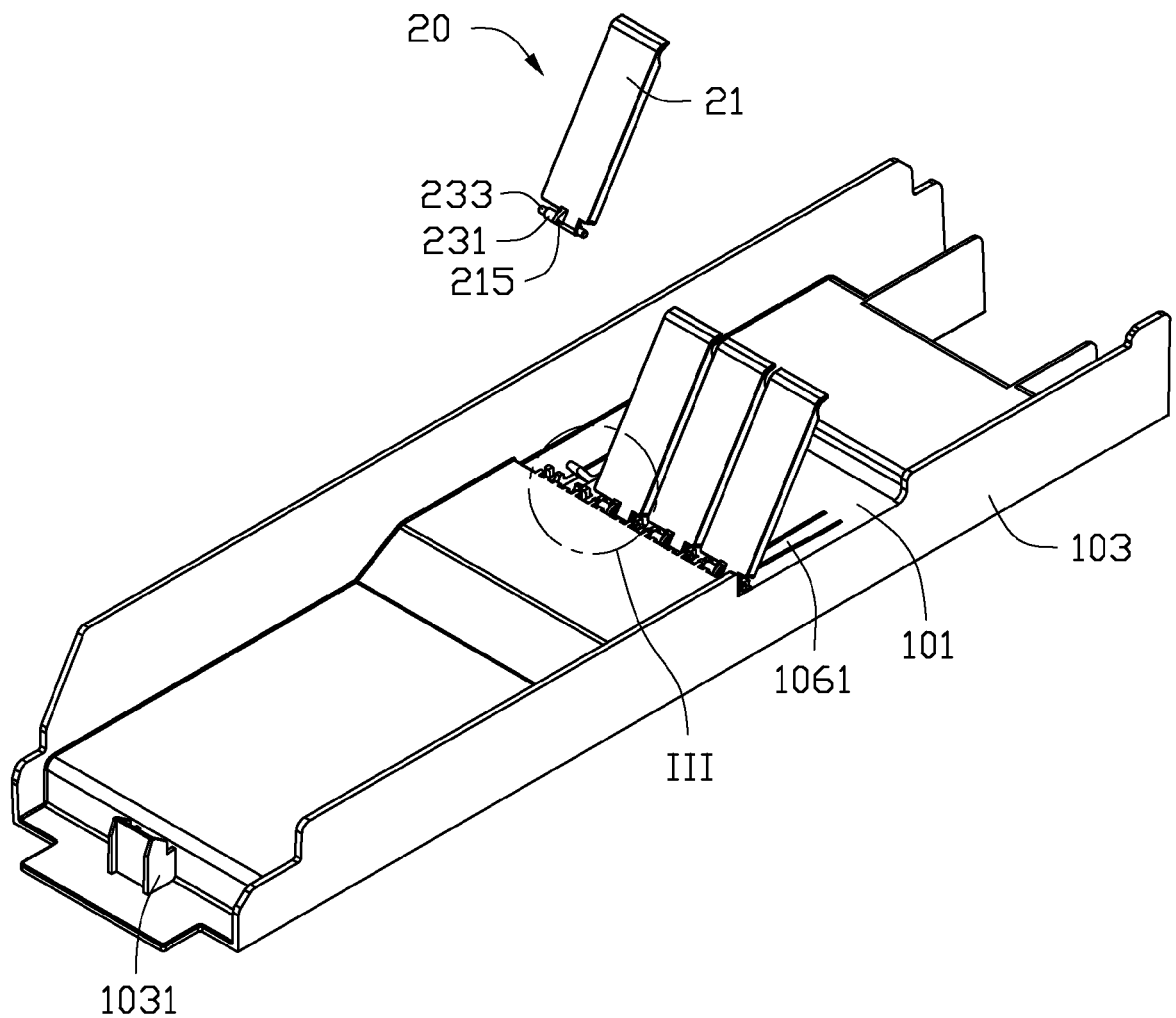
FIG. 2 is a partially exploded, isometric view of an air duct of the computer system in accordance with an embodiment.
Figure 3:
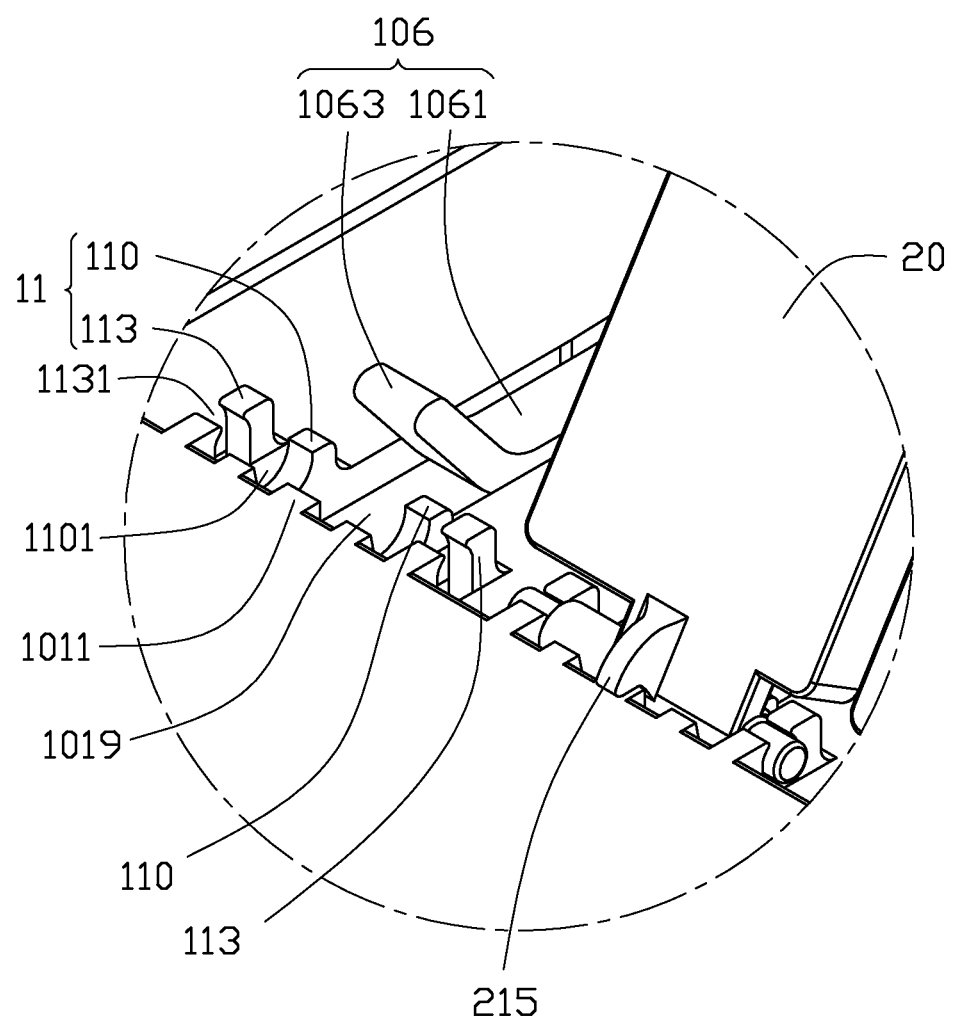
FIG. 3 is an enlarged view of circled portion III of FIG. 2.
Figure 5:
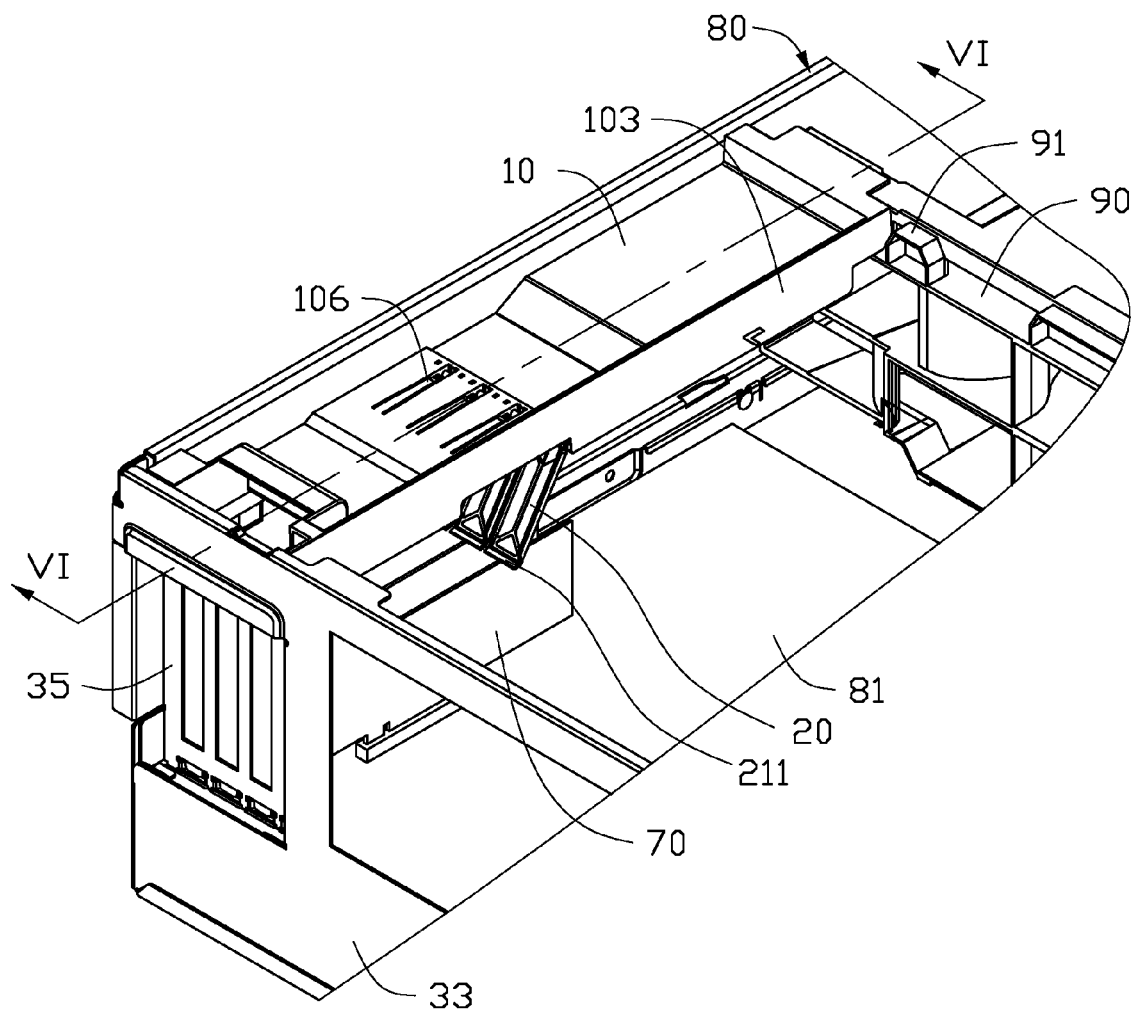
FIG. 5 is an assembled, isometric view of FIG. 1, and a plurality of first electronic components mounted in the computer system.

FIGS. 1-3 show the air duct 10 including a top wall 101, two sidewalls 103, and a plurality of blocking plates 20. The two sidewalls 103 extend from two opposite sides of the top wall 101. The top wall 101 defines a plurality of cutouts 1019. A resilient arm 106 extends from a first edge of each of the plurality of cutouts 1019 towards a second edge of each of the plurality of cutouts 1019 that is opposite to the first edge. A limiting block 1011 extends from the second edge towards the first edge. The resilient arm 106 includes a resilient piece 1061 and a resisting piece 1063. The resilient piece 1061 and the limiting block 1011 are located in the cutout 1019. The resisting piece 1063 extends obliquely from the resilient piece 1061. An angle is defined between the resisting piece 1063 and the resilient piece 1061, and the angle is acute. A gap is defined between the resisting piece 1063 and the second edge for receiving the resisting piece 1063 when the resilient arm 106 is elastically deformed. FIG. 3 and FIG. 5, show a mounting portion 11 extending from each of two opposite sides of each of the plurality of cutouts 1019 in the top wall 101. The mounting portion 11 is adjacent to the second edge of each of the plurality of cutouts 1019. The mounting portion 11 includes a pair of hooks 113 and a pair of protrusions 110. A latching slot 1131 is defined between the pair of the hooks 113. An installation slot 1101 is defined between the pair of the protrusions 110. A resisting portion 1031 is located on the top wall 101.

Figure 4:
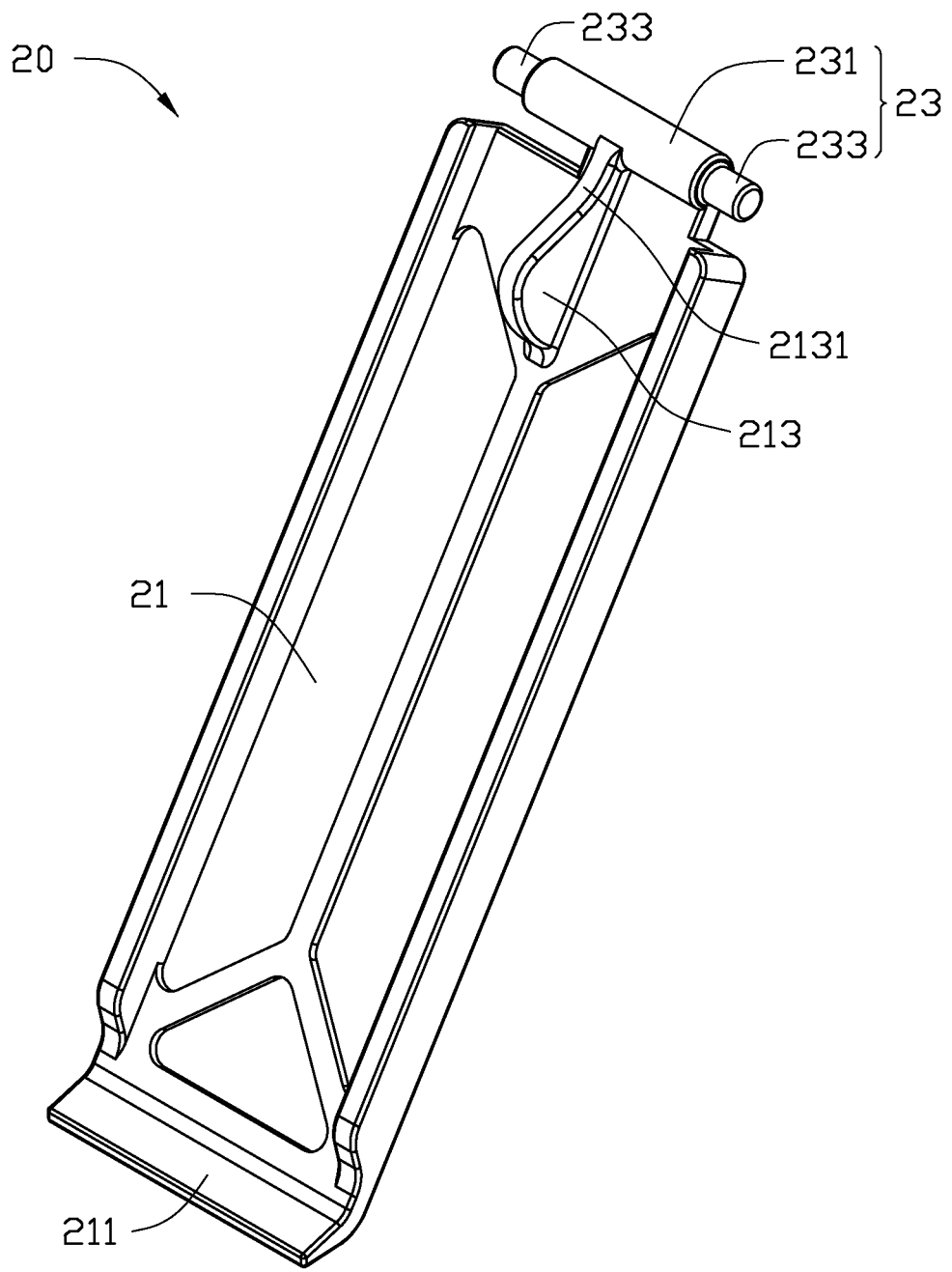
FIG. 4 is an isometric view of a blocking plate of FIG. 1.

FIG. 4, shows each of the plurality of blocking plates 20 includes a body 21 and a shaft 23. The shaft 23 is connected to a first end of the body 21. A restricting portion 211 extends obliquely from a second end of the body 21, and the second end is opposite to the first end. A positioning portion 213 extends from a bottom surface of the body 21 and is adjacent to the shaft 23. A limiting portion 215 extends from a top surface of the body 21, and the top surface is opposite to the bottom surface. The limiting portion 215 is adjacent to the shaft 23. In one embodiment, the positioning portion 213 is substantially perpendicular to the body 21. The positioning portion 213 defines a recession 2131. The shaft 23 includes an installation portion 231 and two latching portions 233. The two latching portions 233 extend from two opposite ends of the installation portion 231. In one embodiment, a cross section of each of the two latching portions 233 and the installation portion 231 is round. A diameter of the installation portion 231 is greater than a diameter of each of the two latching portions 233. The diameter of each of the two latching portions 233 is substantially equal to a greatest distance between each of the pair of hooks 113 and greater than a smallest distance between each of the pair of hooks 113. The diameter of the installation portion 231 is substantially equal to a greatest distance between the pair of the protrusions 110 and greater than a smallest distance between each of the pair of hooks 113. The installation portion 231 can be engaged in the installation slot 1101, and each of the two latching portions 233 can be engaged in the latching slot 1131.

FIGS. 1-4, show in assembly, each of the blocking plates 20 is moved adjacent to the top wall 101, the installation portion 231 is aligned with the installation slot 1101, and each of the two latching portions 233 is aligned with the latching slot 1131. The shaft 23 is pressed towards the top wall 101 and elastic deforms the pair of hooks 113, until the installation portion 231 is received in the installation slot 1101, the latching portion 233 is received in the latching slot 1131, and the resisting piece 1063 is located in the recession 2131. The pair of the hooks 113 rebounds to engage the shaft 23 in the installation slot 1101 and the latching slot 1131. The resisting piece 1063 abuts the recession 2131. The shaft 23 is rotatable in the installation slot 1101 and the latching slot 1131. The limiting portion 215 abuts the limiting block 1011, to prevent the shaft 23 from rotating towards or away from the top wall 101. The installation portion 231 is received between two of the pairs of hooks 113 located on two opposite sides of the cutout 1019, to prevent the shaft 23 from rotating along the latching slot 1131.

Figure 6:
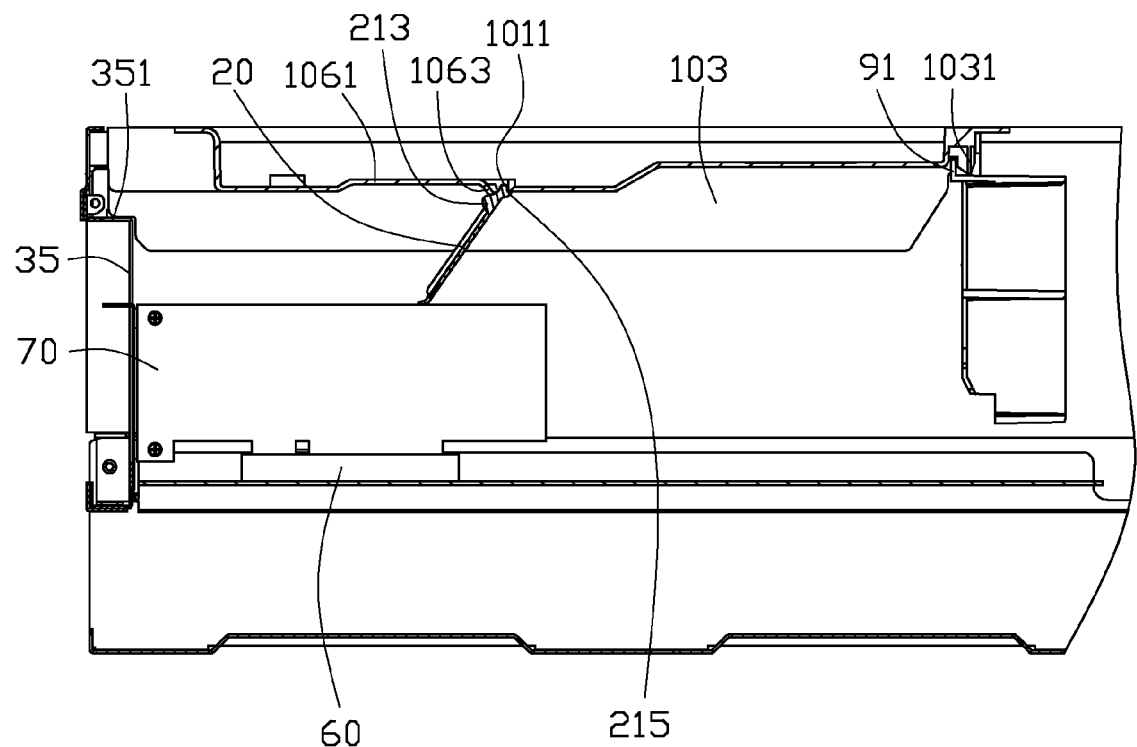
FIG. 6 is a cutaway view, taken along a line VI-VI of FIG. 5.
Figure 7:
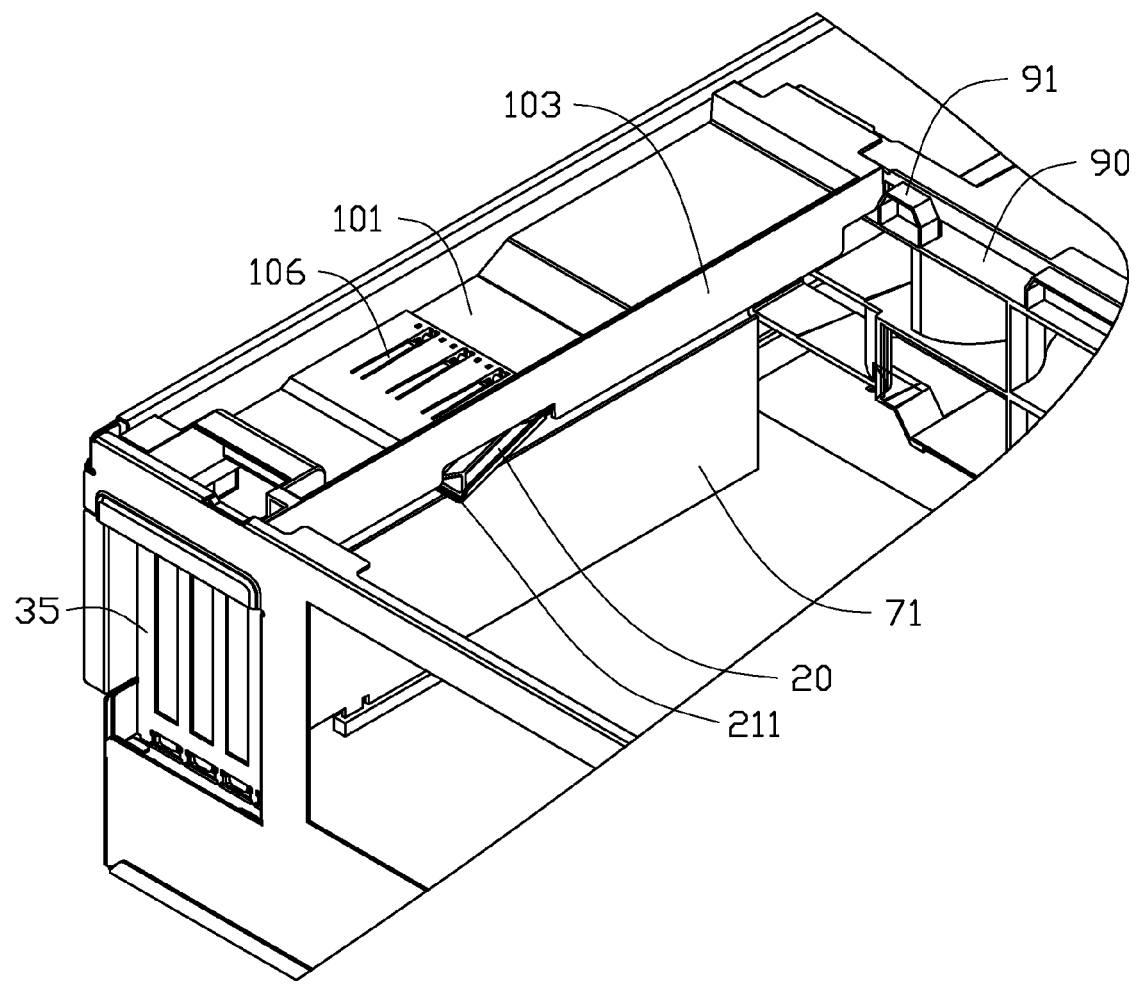
FIG. 7 is similar to FIG. 5, but a plurality of second electronic components mounted in the computer system.

FIGS. 1-7, show the host 80 includes a chassis 30 and motherboard 81 located in the chassis 30. The chassis 30 includes a bottom plate 32, two side plates 31 (only a side plate 31 is shown in FIGS. 1, 5 and 6), and a rear plate 33. The motherboard 81 is secured to the bottom plate 32. A bracket 90 is secured to the bottom plate 32 and located between the two side plates 31. The bracket 90 includes a plurality of assisting portions 91. A receiving slot 93 is defined between two of the plurality of assisting portions 91. A plurality of inserting slots 60 is located on the motherboard 81. The plurality of inserting slot 60 is for the insertion of a plurality of first electronic components 70 and a plurality of second electronic components 71. A height of each of the plurality of first electronic components 70 is less than a height of each of the plurality of second electronic components 71. A frame 35 is located on the rear plate 33 for securing the plurality of first electronic components 70 and the plurality of second electronic components 71. The frame 35 includes a top panel 351.

In use, the air duct 10 is placed on the frame 35 and the bracket 90, and the resisting portion 1031 is engaged in the receiving slot 93. First ends of the two sidewalls 103 are located on two opposite sides of two of the assisting portions 91. Second ends the two sidewalls 103 abut the top panel 351. When the plurality of first electronic components 70 are inserted in the plurality of inserting slots 60, the restricting portion 211 abuts each of the first electronic components 70. Airflow is guided towards the plurality of first electronic components 70 by the plurality of blocking plates 20. When the plurality of second electronic components 71 are inserted in the plurality of inserting slots 60, each of the blocking plates 20 is rotated towards the top wall 101 from being blocked by each of the second electronic components 71. The resilient arm 106 is elastically deformed upwards, and then each of the blocking plates 20 is secured between the resilient arm 106 and the each of the second electronic components 71. The resilient arm 106 exerts elastic force to abut a top end of each of the second electronic components 71

It is to be understood, however, that even though numerous characteristics and advantages have been set forth in the foregoing description of embodiments, together with details of the structures and functions of the embodiments, the disclosure is illustrative only and changes may be made in detail, especially in matters of shape, size, and arrangement of parts within the principles of the disclosure to the full extent indicated by the broad general meaning of the terms in which the appended claims are expressed.

What is claimed is:

1. An air duct comprising:
a top wall comprising a limiting block, a resilient arm, a pair of hooks; and a latching slot defined between the pair of hooks; and
a blocking plate rotatably secured to the top wall; the blocking plate comprising a body and a shaft connected to the body, and the shaft being rotatably engaged in the latching slot; the limiting block and the resilient arm abut two opposite surfaces of the body and block the body therebetween; the blocking plate is prevented from rotating relative to the top wall by the limiting block and the resilient arm; and the blocking plate is configured to abut an electronic component and guide air to flow towards the electronic component.

2. The air duct of claim 1, wherein the blocking plate is operable to elastically deform the resilient arm, and the blocking plate is rotatable when the resilient arm is elastically deformed; and the blocking plate is configured to be secured between the resilient arm and the electronic component.

3. The air duct of claim 1, wherein the top wall defines a cutout; the resilient arm comprises a resilient piece and a resisting piece, the resilient piece extends from a first edge of the cutout towards a second edge opposite to the first edge, and the resilient piece is received in the cutout; the resisting piece extends obliquely from the resilient piece and out of the cutout.

4. The air duct of claim 3, wherein the blocking plate further comprises a limiting portion and a positioning portion, and the limiting portion and the positioning portion are located on two opposite sides of the body; the limiting portion abuts the limiting block; the positioning portion defines a recession, and the resisting piece is engaged in the recession.

5. The air duct of claim 3, wherein an angle is defined between the resilient piece and the resisting piece, and the angle is acute.

6. The air duct of claim 3, wherein the top wall further comprises a pair of protrusions, and an installation slot is defined between the pair of protrusions; the shaft comprises a installation portion and a latching portion extending from the installation portion, the installation portion is engaged in the installation slot, and the latching portion is engaged in the latching slot.

7. The air duct of claim 6, wherein a cross section of each of the installation portion and the latching portion is round, and a diameter of the installation portion is greater than a diameter of the latching portion.

8. The air duct of claim 6, wherein the top wall further comprises a second pair of hooks, the pair of protrusions are located between the pair of hooks and the second pair of hooks, and the installation portion is received between the pair of hooks and the second pair of hooks.

9. The air duct of claim 6, wherein a greatest distance between the pair of hooks is substantially equal to the diameter of the latching portion; and a smallest distance between the pair of hooks is greater than the diameter of the latching portion.

10. The air duct of claim 6, wherein the greatest distance between the pair of hooks is smaller than the diameter of the installation portion, and a greatest distance between the pair of protrusions is substantially equal to the diameter of the installation portion.

11. A computer system comprising:
a chassis comprising a bottom plate and a rear plate connected to the bottom plate; the rear plate comprising a frame, and a bracket secured to the bottom plate and being opposite to the frame;
a motherboard secured to the bottom plate, and an electronic component secured to the motherboard; and
an air duct comprising:
a top wall and two sidewalls connected to the top wall; the top wall comprising a limiting block, a resilient arm, a pair of hooks; and a latching slot defined between the pair of hooks; and
a blocking plate rotatably secured to the top wall; the blocking plate comprising a body and a shaft connected to the body, and the shaft being rotatably engaged in the latching slot; the limiting block and the resilient arm abut two opposite surfaces of the body and block the body therebetween; the blocking plate is prevented from rotating relative to the top wall by the limiting block and the resilient arm; and the blocking plate abuts the electronic component and guide air to flow towards the electronic component;
wherein the top wall further comprising a resisting portion; the frame comprising a top panel; the bracket comprising two assisting portions, and a receiving slot is defined between the two assisting portions; a first end of each of the two sidewalls is engaged with the bracket, and the resisting portion is received in the receiving slot; a second end of each of the two sidewalls abuts the frame.

12. The computer system of claim 11, wherein the blocking plate is operable to elastically deform the resilient arm, and the blocking plate is rotatable when the resilient arm is elastically deformed; and the blocking plate is secured between the resilient arm and the electronic component.

13. The computer system of claim 11, wherein the top wall defines a cutout; the resilient arm comprises a resilient piece and a resisting piece, the resilient piece extends from a first edge of the cutout towards a second edge opposite to the first edge, and the resilient piece is received in the cutout; the resisting piece extends obliquely from the resilient piece and out of the cutout.

14. The computer system of claim 13, wherein the blocking plate further comprises a limiting portion and a positioning portion, and the limiting portion and the positioning portion are located on two opposite sides of the body; the limiting portion abuts the limiting block; the positioning portion defines a recession, and the resisting piece is engaged in the recession.

15. The computer system of claim 13, wherein an angle is defined between the resilient piece and the resisting piece, and the angle is acute.

16. The computer system of claim 13, wherein the top wall further comprises a pair of protrusions, and an installation slot is defined between the pair of protrusions; the shaft comprises a installation portion and a latching portion extending from the installation portion, the installation portion is engaged in the installation slot, and the latching portion is engaged in the latching slot.

17. The computer system of claim 16, wherein a cross section of each of the installation portion and the latching portion is round, and a diameter of the installation portion is greater than a diameter of the latching portion.

18. The computer system of claim 16, wherein the top wall further comprises a second pair of hooks, the pair of protrusions are located between the pair of hooks and the second pair of hooks, and the installation portion is received between the pair of hooks and the second pair of hooks.

19. The computer system of claim 16, wherein a greatest distance between the pair of hooks is substantially equal to the diameter of the latching portion; and a smallest distance between the pair of hooks is greater than the diameter of the latching portion.

20. The computer system of claim 16, wherein the greatest distance between the pair of hooks is smaller than the diameter of the installation portion, and a greatest distance between the pair of protrusions is substantially equal to the diameter of the installation portion.

* * * * *